United States Patent
Asper

(10) Patent No.: US 7,373,287 B2
(45) Date of Patent: May 13, 2008

(54) FINITE ELEMENT ANALYSIS TIRE FOOTPRINT SMOOTHING ALGORITHM USING MULTIPLE LOAD CASES

(75) Inventor: Robert W. Asper, Wadsworth, OH (US)

(73) Assignee: Bridgestone Firestone North American Tire, LLC, Nashville, TN (US)

( * ) Notice: Subject to any disclaimer, the term of this patent is extended or adjusted under 35 U.S.C. 154(b) by 350 days.

(21) Appl. No.: 10/914,679

(22) Filed: Aug. 9, 2004

(65) Prior Publication Data

US 2006/0031046 A1  Feb. 9, 2006

(51) Int. Cl.
 *G06G 7/48* (2006.01)
 *G06F 9/45* (2006.01)

(52) U.S. Cl. ............................................ 703/8; 703/22
(58) Field of Classification Search .................. 703/22, 703/8
See application file for complete search history.

(56) References Cited

U.S. PATENT DOCUMENTS

| | | | |
|---|---|---|---|
| 5,042,546 A * | 8/1991 | Forney et al. ............... | 152/454 |
| 5,710,718 A | 1/1998 | Kamegawa et al. | |
| 6,083,268 A * | 7/2000 | Kelsey et al. .................. | 703/7 |
| 6,199,026 B1 * | 3/2001 | Shiraishi et al. ............ | 702/140 |
| 6,430,993 B1 * | 8/2002 | Seta ............................. | 73/146 |
| 6,564,625 B1 | 5/2003 | Ishiyama | |
| 6,678,642 B1 | 1/2004 | Budge | |
| 6,691,566 B2 | 2/2004 | Iwasaki et al. | |
| 6,697,772 B2 * | 2/2004 | Mancosu et al. ............... | 703/2 |
| 6,718,291 B1 | 4/2004 | Shapiro et al. | |
| 6,725,168 B2 * | 4/2004 | Shiraishi et al. .............. | 702/81 |
| 7,050,952 B2 * | 5/2006 | Kabe et al. ..................... | 703/2 |
| 7,254,492 B2 * | 8/2007 | Miyamoto et al. ............. | 702/44 |
| 2001/0032694 A1 * | 10/2001 | Ishiyama .................. | 156/110.1 |
| 2002/0014114 A1 * | 2/2002 | Mancosu et al. ............. | 73/146 |
| 2003/0055617 A1 | 3/2003 | Iwasaki et al. | |
| 2004/0107081 A1 | 6/2004 | Miyori et al. | |
| 2006/0031046 A1 * | 2/2006 | Asper ............................ | 703/2 |

* cited by examiner

*Primary Examiner*—Kamini Shah
*Assistant Examiner*—David Silver
(74) *Attorney, Agent, or Firm*—James A. Oliff; Thomas R. Kingsbury

(57) ABSTRACT

A method and apparatus for predicting the shape of a contact region of a finite element model deformed against a contact surface. The contact surface may be a rigid body or another finite element model. The shape of a contact region is dictated by the node/element distribution in response to a simulated load. This procedure uses curve fitting to predict the boundary of a contact region for a specified load condition based upon an analysis of contact region shapes generated by finite element analysis for each load within a range of simulated loads. In this manner, the discrete nature of the contact region boundary associated with finite element analysis results at a single load is overcome using information derived from previous load simulations. The approach improves the accuracy and resolution of simulated contact shape boundaries without a corresponding increase in processing resources.

13 Claims, 6 Drawing Sheets

FINITE ELEMENT ANALYSIS TIRE FOOTPRINT SMOOTHING ALGORITHM USING MULTIPLE LOAD CASES

BACKGROUND OF THE INVENTION

1. Field of Invention

The present invention pertains to finite element analysis. In particular, the present invention pertains to smoothing finite element analysis generated tire footprints.

2. Description of Related Art

A commonly recognized problem associated with conventional finite element analysis (FEA) techniques is that processor resources (e.g. dynamic memory, processing cycles, non-volatile storage, etc.), as well as processing time required to perform an FEA analysis, increase in response to increases in the FEA mesh resolution. Processor resources increase because each point of intersection of an FEA mesh applied to a finite element model represents a point for which processing, storage, and analysis is performed. Depending upon the nature of the finite element analysis to be performed, processor resources may rise significantly in response to a slight increase in the applied FEA mesh resolution.

Unfortunately, the discrete nature of finite element analysis is most pronounced at the outer edges of the finite element analysis region. In FEA applications used to display visual output of results, the discrete nature of finite element analysis manifests itself as extended, truncated and/or rough edges in generated images. One conventional approach for improving the appearance of generated images is to increase the resolution of the FEA mesh. Unfortunately, FEA mesh resolutions sufficiently fine to smooth image boundaries typically result in unacceptable increases in processor resources, as described above.

Researchers attempting to use finite element analysis to study contact regions between objects in contact with one another are particularly hard-hit by the unfortunate relationship between FEA mesh resolutions and increases in processor resources, described above. This is because contact regions between objects are typically characterized by an outer boundary which defines the area of contact between the objects. An inability of conventional finite element analysis techniques to provide timely and accurate contact region boundary information significantly reduces the value of finite element analysis to researchers in this field of study.

Hence, a need remains for a method and apparatus for improving the accuracy and resolution of the shape, or boundary, of a contact region of a finite element model deformed against a contact surface which does not significantly increase the computer resources and/or processing time necessary to perform the simulation. The results generated using the approach should be consistent with contact region boundary results produced by observed physical experiments under similar load conditions. Preferably, the approach should be compatible with and be capable of being integrated with existing finite element analysis toolsets and data.

SUMMARY OF THE INVENTION

In accordance with the present invention, a method and apparatus for predicting the shape of a contact region of a finite element model deformed against a contact surface. The contact surface may be a rigid body or another finite element model. The shape of a contact region is dictated by the node/element distribution in response to a simulated load. The described approach uses curve fitting to predict the boundary of a contact region for a specified load condition based upon an analysis of contact region shapes generated by finite element analysis for each load within a range of simulated loads. In this manner, the discrete nature of the contact region boundary typically associated with finite element analysis results based upon a single load analysis is overcome using information derived from multiple previous load simulations. The approach improves the accuracy and resolution of simulated contact shape boundaries without a corresponding increase in processing resources.

In a first exemplary embodiment of the invention, a method for smoothing a perimeter boundary of a finite element analysis generated contact region is described that includes generating a plurality of contact regions, generating a contact region boundary data for each of the plurality contact regions, generating a plurality of load-averaged curve equations based upon the contact region boundary data, generating a predicted boundary for a contact region based upon the plurality of load-averaged curve equations and optionally scaling the contact region for display within the predicted boundary.

In a second exemplary embodiment of the invention, an apparatus is described for smoothing a perimeter boundary of a finite element analysis generated contact region that includes an analysis module that generates a plurality of contact regions, a boundary module that generates a contact region boundary data for each of the plurality contact regions, a curve-fitting module that generates a plurality of load-averaged curve equations based upon the contact region boundary data and a merge module that generates a predicted boundary for a contact region based upon the plurality of load-averaged curve equations and optionally scales the contact region for display within the predicted boundary.

In a third exemplary embodiment of the invention, a program product apparatus is described having a computer readable medium with computer program logic recorded thereon for smoothing a perimeter boundary of a finite element analysis generated contact region that includes an analysis module that generates a plurality of contact regions, a boundary module that generates a contact region boundary data for each of the plurality contact regions, a curve-fitting module that generates a plurality of load-averaged curve equations based upon the contact region boundary data and a merge module that generates a predicted boundary for a contact region based upon the plurality of load-averaged curve equations and optionally scales the contact region for display within the predicted boundary.

The above features and advantages of the present invention will become apparent upon consideration of the following descriptions and descriptive figures of specific exemplary embodiments thereof. While these descriptions go into specific details of the invention, it should be understood that variations may and do exist and would be apparent to those skilled in the art based on the descriptions herein.

DETAILED DESCRIPTION OF PREFERRED EMBODIMENTS

Figure 1:
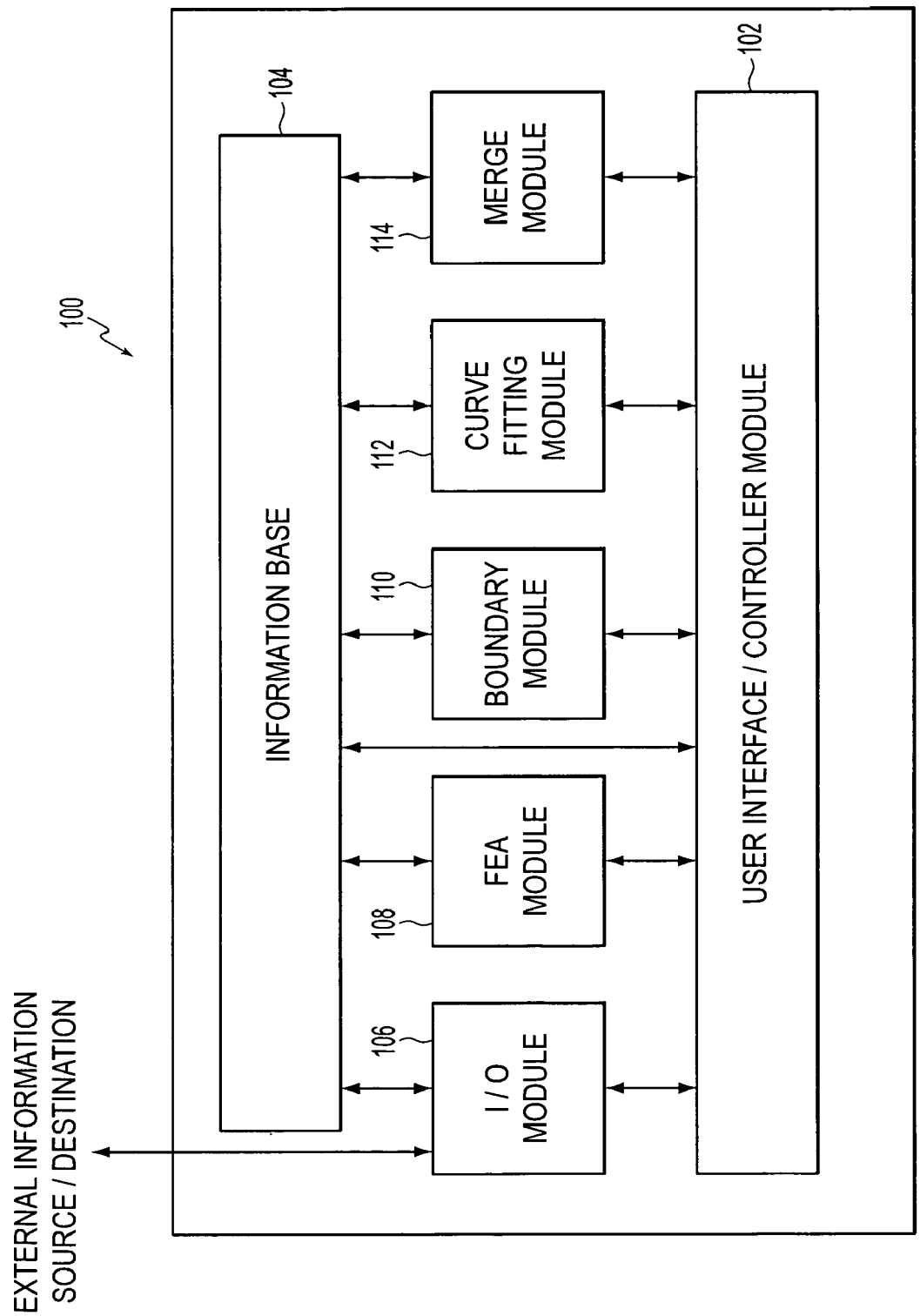
FIG. 1 is a block diagram of a finite element analysis system that supports improved modeling of contact region boundaries in accordance with an exemplary embodiment of the present invention.

Exemplary embodiments according to the present invention are described below with reference to the above drawings, in which like reference numerals designate like components.

Exemplary embodiments of the present invention relate to a novel method and apparatus for predicting the shape of a contact region of a finite element model deformed against a contact surface.

FIG. 1 presents a block diagram of a representative finite element analysis (FEA) processing system 100 that includes the contact region boundary prediction capabilities of the present invention. As shown in FIG. 1, FEA system 100 may include a user interface/controller module 102 in communication with an information base 104. FEA system 100 may further include an input/output (I/O) module 106, an FEA module 108, a boundary module 110, a curve-fitting module 112 and a merge module 114. Each of these modules may communicate with information base 104, either directly or via user interface/controller module 104.

FEA system 100 may receive finite element analysis models via user interface/controller module 102 and/or via I/O module 106. The received models may be stored in information base 104 for subsequent use in support of finite element analysis and contact region boundary prediction. Interface/controller module 102 may allow a user to interface with and to manually control FEA system 100. Preferably, interface/controller module 102 may include automated processes for coordinating the capabilities of the remaining FEA system modules in support of finite element analysis and contact region boundary prediction operations, as described below.

FEA module 108, may generate FEA analysis results for a selected model for a set of user configurable simulation parameters. Upon receipt of a user or automation based FEA analysis request via interface/controller module 102, FEA module 108 may perform a requested FEA contact region analysis based upon the model and simulation parameters selected and may store the generated data describing the predicted contact region. Typical simulation parameters include the finite element model selected, the contact surface with which the model is to be placed in simulated contact, the load (or weight) to be simulated and parameters related to the resolution of the FEA mesh to be used during the simulation. FEA module 108 may store the generated finite element analysis results in information base 104 for later processing and/or display to the user via user interface/controller 102. For example, in support of contact region predicted boundary processing, described below, the user interface/controller module may instruct FEA module 108 to generate an FEA contact region for a selected finite element model for multiple load values within a specified load range. For example, the FEA module 108 may be instructed to generate a contact region for the load range from 800 lbs. to 1300 lbs. in increments of 30 lbs. (i.e., at 800, 830, 860, . . . 1220, 1250 and 1280 lbs.). The contact region results generated for each respective simulated load may be stored in information base 104.

Boundary module 110, may retrieve finite element analysis contact region results produced by FEA module 108, as described above, and process the retrieved results to determine a boundary for each retrieved contact region. In one exemplary embodiment, boundary module 110 may determine a length of the contact region at each cross-section of the contact region and the respective vertical lines of the FEA mesh used to generate the contact region and may determine a width of the contact region at each cross-section of the contact region and the respective horizontal lines of the FEA mesh. Boundary module 110 may store the generated contact region boundary data within information base 104. For example, in support of contact region predicted boundary processing, described below, the user interface/controller module may instruct boundary module 110 to generate a contact region boundary for each set of contact region data generated for each load simulated by FEA module 108 within a specified load range, as described above. The contact region boundary data generated by the boundary module 110 for each respective load may be stored in information base 104.

Curve-fitting module 112, may retrieve from information base 104 finite element analysis contact region boundary results generated by boundary module 110 and further process the generated results. For example, in one exemplary embodiment curve-fitting module 112 retrieves from information base 104, contact region boundary length and width data, for each simulated load within a range of FEA load simulations. Curve-fitting module 112 may organize the respective contact region boundary length data values, generated for the full range of retrieved FEA load simulations, by the FEA mesh vertical cross-section for which the respective boundary length data values were generated. Further, curve-fitting module 112 may organize the respective contact region boundary width data values, generated for the full range of retrieved FEA load simulations, by the FEA mesh horizontal cross-section for which the respective boundary width data values were generated.

Figure 2:
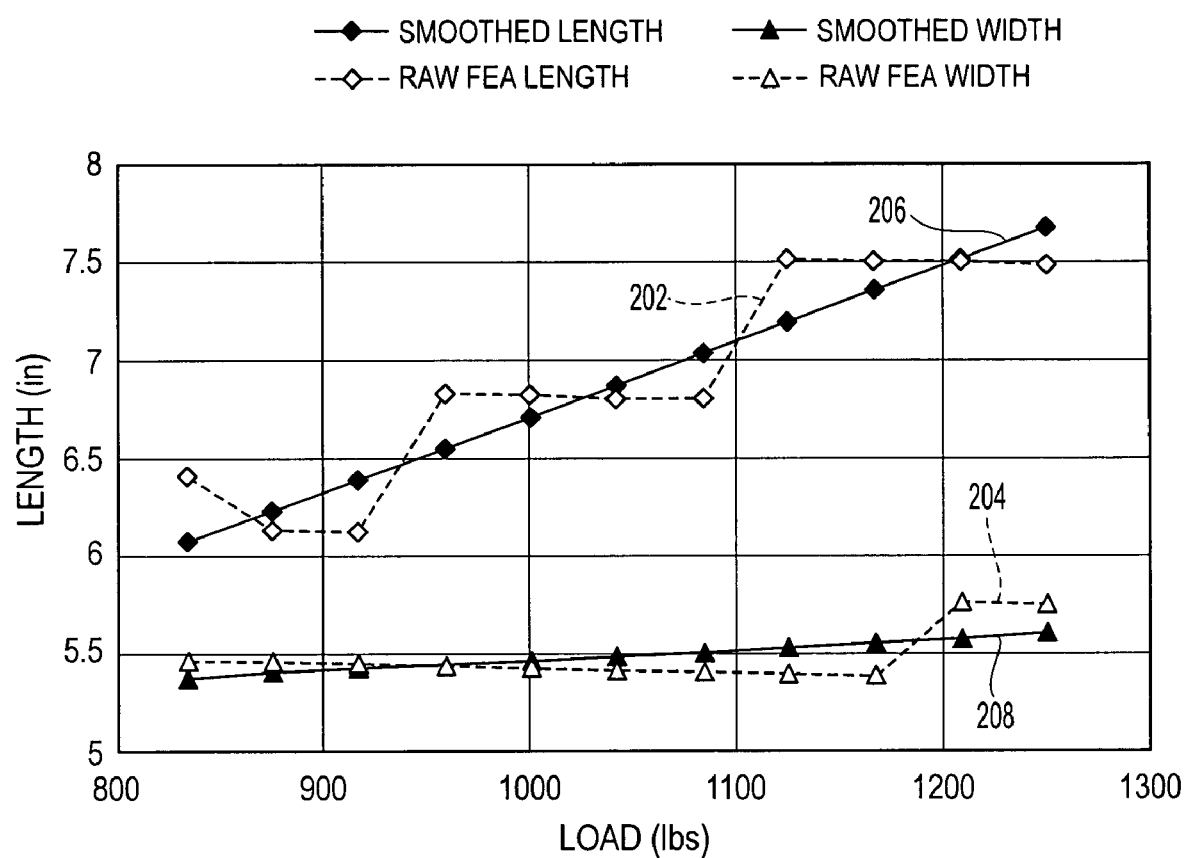
FIG. 2 charts contact region length data and contact region width data for contact regions generated for a range of finite element analysis simulated load conditions.

Plots of representative raw FEA length data for a single set of contact region cross-sections (i.e., cross-sections of the contact regions generated for a range of load with a selected vertical element of the FEA mesh used to generated the respective contact regions) and representative raw FEA width data for a single set of contact region cross-sections (i.e., cross-sections of the contact regions generated for a range of load with a selected horizontal element of the FEA mesh used to generated the respective contact regions) are presented in FIG. 2 at 202 and 204 respectively. Based upon such data, curve-fitting module 112 performs linear and/or non-linear curve fitting to define an equation for a linear, piece-wise linear, and/or curved line which represents a best-fit approximation of the raw FEA data. The defined best-fit equation generated curve-fitting module 112 may have a slope, or slopes, that approximate the rate of change in the respective length or width data over a specified range of loads. Due to the discrete, stepped nature typical of raw FEA data, the best-fit approximation of the raw FEA data often appears to split, or average, the difference between the raw FEA data points. Therefore the best-fit equation may typically be referred to as a load-averaged equation, or a load-averaged curve equation, and data generated as output from the best-fit equation may typically be referred to as load-averaged data. The load-averaged equation may be used to generate values that approximate averaged, or smoothed, length or width values, respectively, for a continuous range of loads across the range of loads for which discrete FEA analysis was performed. For example, plots of representative load-averaged, or smoothed, FEA length data and representative load-averaged, or smoothed, FEA width data are presented in FIG. 2 at 206 and 208 respectively. Smooth curves 206 and 208 are examples of load-averaged data generated by curve-fitting module 112. This load-averaged data may be used to predicted a boundary for an FEA generated contact region, as described below.

Merge module 114 may operate in conjunction with FEA module 108 and user interface/controller 102 to generate an FEA contact region that includes a boundary predicted using load-averaged, or smoothed, length and width data generated by curve-fitting module 112, as described above. In accordance with an exemplary embodiment of the present invention, upon request from a user for an FEA generated contact region with a predicted boundary, interface/controller module 102 may initiate FEA module 108 to generate an FEA contact region for a user selected finite analysis model under load conditions and an FEA mesh resolution specified by the user.

In response to the user's request for a predicted contact region boundary, user interface/controller module 102 may instruct merge module 114 to generate a predicted contact region boundary for the user specified FEA simulated load based upon load-averaged data or load-averaged curve equations generated by curve-fitting module 112, as described above. For example, in one exemplary embodiment, the merge module generates, based upon the generated load-averaged curves and the currently selected simulated load value, a length value for each FEA mesh vertical cross-section and width values for each FEA mesh horizontal cross-section. In such an exemplary embodiment, each of the respective length values may be aligned with a respective vertical mesh element and may be centered on a common horizontal axis of a common two-dimensional coordinate system. Further, each of the respective width values may be aligned with a respective horizontal mesh element and may be centered on a common vertical axis of the common two-dimensional coordinate system. A set of two-dimensional (i.e., X/Y) coordinates may then be generated for each point on the predicted boundary. For example, in one exemplary embodiment, each point on a leading or trailing edge of the boundary is specified by an FEA mesh vertical cross-section and one-half the load-averaged length value determined for the respective vertical cross-section. Further, each point on a left edge or a right edge of the boundary is specified by an FEA mesh horizontal cross-section and one-half the load average width value determined for the respective horizontal cross-section. Next, merge module 114 retrieves the contact region generated by FEA module 108 and compresses or expands the visual representation of the generated FEA contact region to fit within the borders of the predicted boundary.

Figure 3:
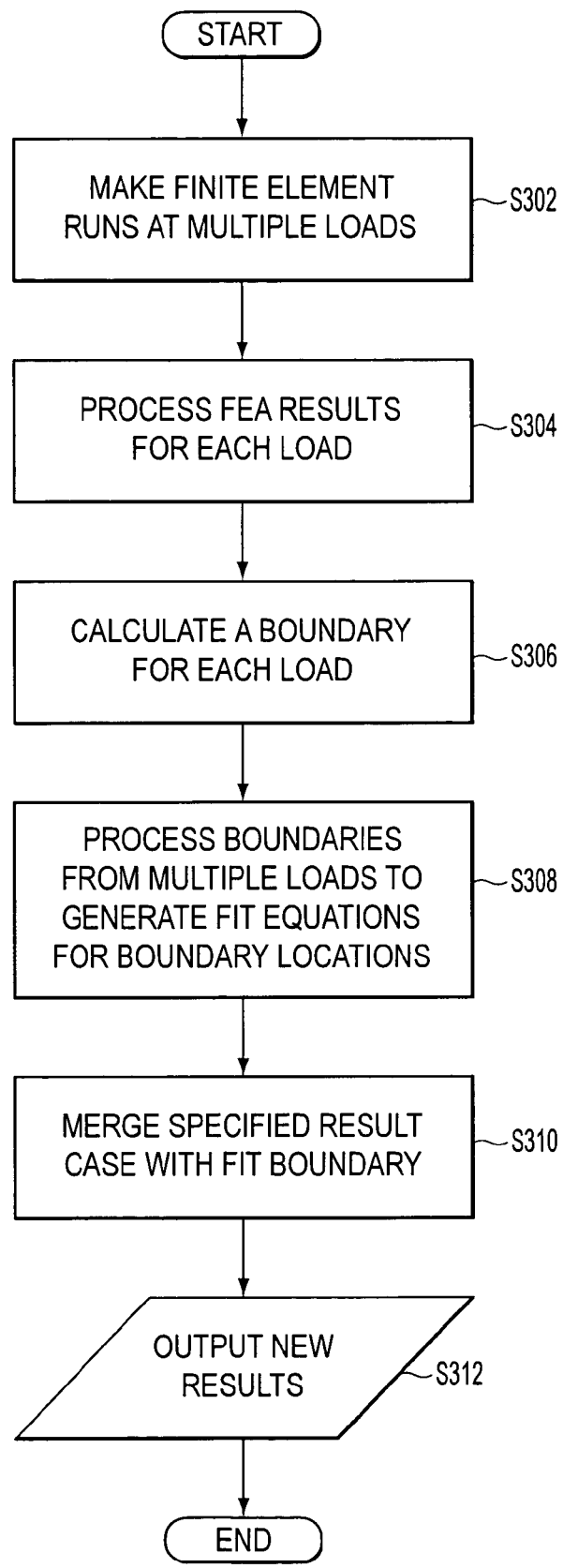
FIG. 3 is a procedural flow chart that summarizes the workflow associated with generating an FEA contact region with a predicted boundary.

FIG. 3 is a procedural flow chart that summarizes the workflow associated with generating a FEA contact region with a predicted boundary based upon load-averaged data, as described above. As shown in FIG. 3, at step S302, FEA module 108 (FIG. 1) may generate FEA contact regions for a selected finite element model over a user configurable range of simulated loads for load values within the range. Preferably, the simulated loads values for which FEA contact regions are generated are evenly space throughout the range of simulated loads, possibly separated by a user configurable increment. The FEA contact regions generated at step S302 are stored, at step S304, within information base 104 (FIG. 1) for use in later processing. At step S306, boundary module 110 (FIG. 1) generates a boundary for each FEA contact region generated at step S302 and stores the boundary related length and width data within information base 104 for use in later processing. Next, at step S308, curve-fitting module 112 (FIG. 1) processes the boundary related length and width data generated at step S306 to generate load-averaged, or smoothed curves, for the user configurable range of simulated loads, for each FEA mesh vertical cross-section for which the respective boundary length data values were generated, at step S306, and for each FEA mesh horizontal cross-section for which the respective boundary width data values were generated, at step S306. Then, at step, S310, merge module 114 (FIG. 1) generates a predicted boundary and scales an FEA contact region to fit within the predicted boundary. Finally, at step S312, the merged FEA contact region and predicted boundary is output via user interface/control module 102 (FIG. 1) to a display or to a printer for review by a user, stored in information base 104, or transmitted via user interface/control module 102 and I/O module 106 (FIG. 1) to an external information destination.

Figure 4A:
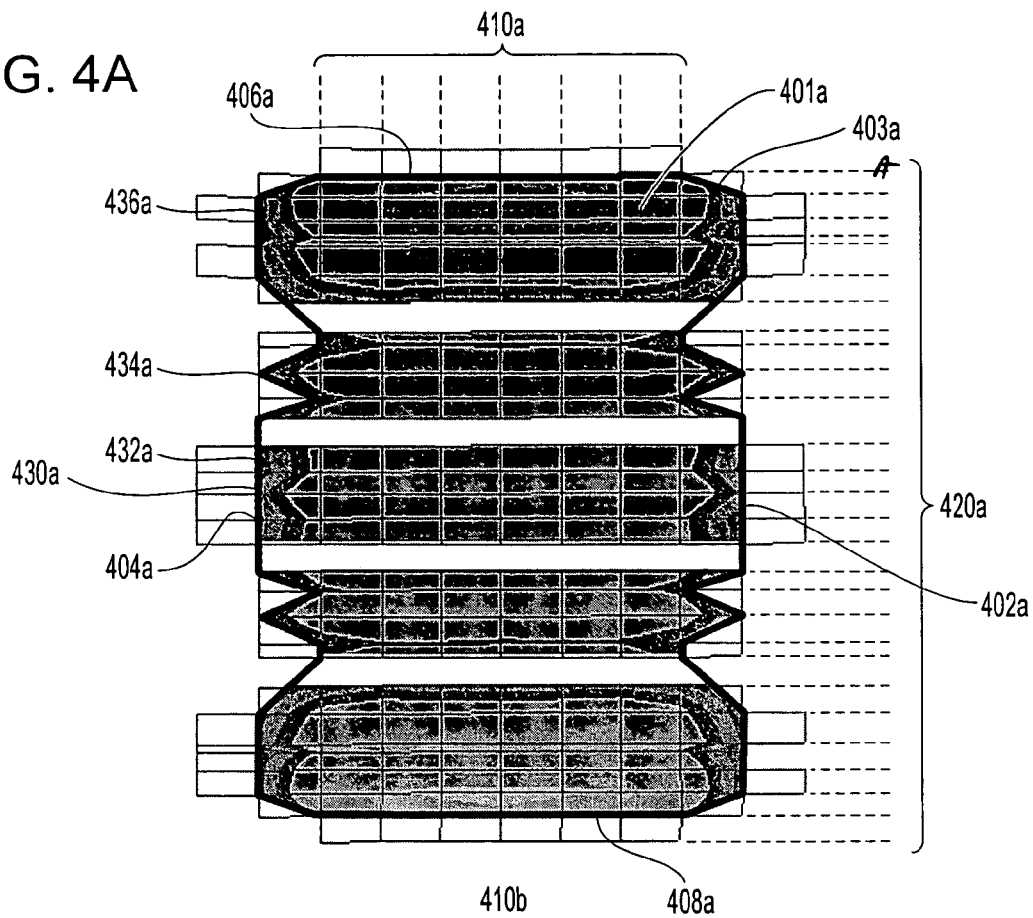
FIG. 4A is a first representative finite element analysis generated contact region.
Figure 4B:
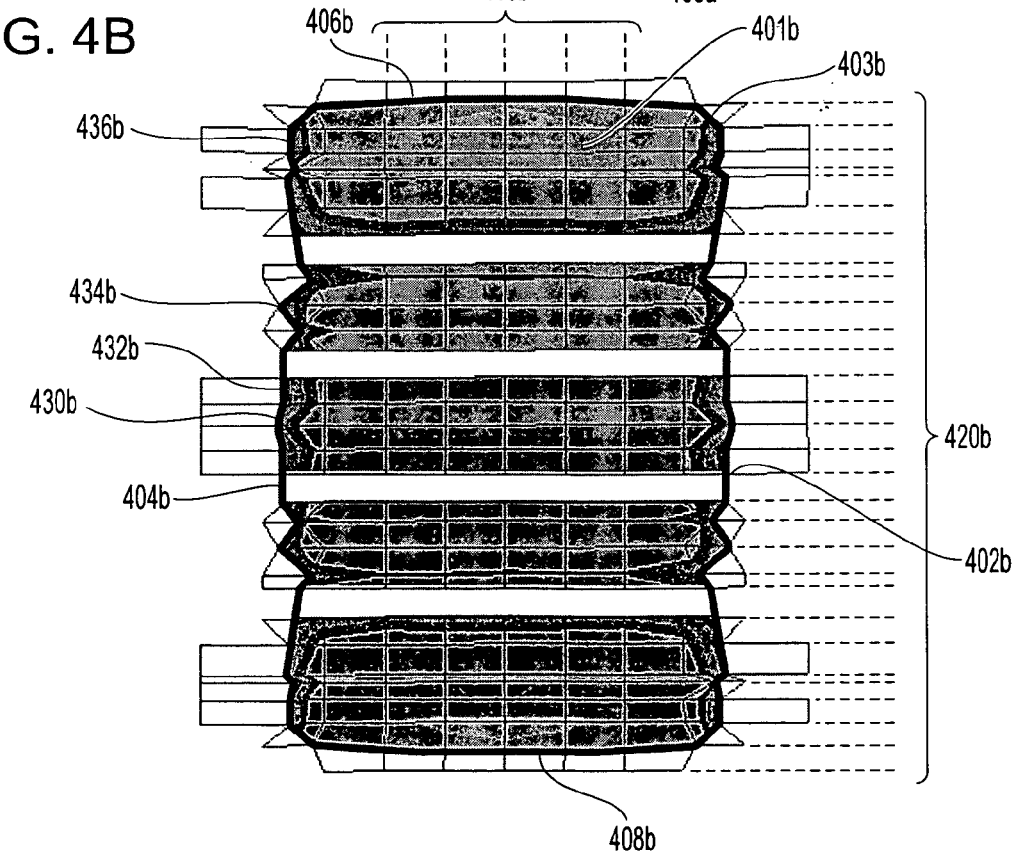
FIG. 4B is the representative contact region of FIG. 4A in which the contact region boundary has been predicted in accordance with an exemplary embodiment of the present invention.

FIGS. 4A and 4B present different views of an FEA contact region generated for a common simulated load value based upon a common finite element model and a common FEA mesh resolution. FIG. 4A presents the generated FEA contact region 401a within the envelop of a contact region boundary 403a that is based only the output generated by conventional FEA processing of a finite element model of the outside surface, or tread, of an automobile tire.

Within FIG. 4A, 402a represents the leading edge of the contact region (i.e., the front edge of the tire as though the tire is rolling from left to right across the page), 404a represents the trailing edge of the contact region (i.e., the rear edge of the tire as though the tire is rolling from left to right across the page), 406a represents the edge formed by the left tire sidewall and 408a represents the edge formed by the right tire sidewall. Further, the dashed lines identified by 410a represent extensions of the horizontal lines within the FEA mesh and the dashed lines identified by 420a represent extensions of the vertical lines within the FEA mesh. By such a convention, the width of the contact region at any given FEA mesh horizontal cross-section is represented by the length of each of the respective lines identified by 410a. Further, the length of the contact region at any given FEA mesh vertical cross-section is represented by the length of each of the respective lines identified by 420a.

In FIG. 4B, the same numerals used to identify features in FIG. 4A, above, are used to identify like features in FIG. 4B, with the exception that the numeral identifiers are followed by a "b" suffix to denote that they are features depicted in FIG. 4B. The most significant feature of FIG. 4B is that the contact region boundary 403b is a predicted boundary generated by merge module 114 (FIG. 1) based upon load-averaged data generated by curve-fitting module 112 (FIG. 1), as described above. Further, the FEA contact region 401b has been adjusted to fit within the perimeter of contact region boundary 403b, as described above.

The effect of using a contact region boundary predicted based upon load-averaged data may be clearly seen by comparing the shape of the boundary edges. For example, a comparison of points along the trailing edge of boundary 401a at 430a, 432a, 434a and 436a with points along the trailing edge of boundary 401b at 430b, 432b, 434b and 436b clearly demonstrates that a difference exists. The effects of the predicted boundary may also be observed by comparing boundary 403a with boundary 403b at points along the left and right tire sidewalls at 406a/406b and 408a/408b, respectively.

The boundary generated by a single FEA analysis is necessarily limited to the discrete boundaries of the FEA mesh used to generate the FEA contact region. Such limitations account for the flat, truncated appearance of the boundary 403a. On the other hand, a predicted boundary based upon load balanced data is not limited to the boundaries of the FEA mesh used to generate a single FEA contact region. Load balanced data reflects an approximation of the response of the finite element model over a range of simulated loads. As a result, a predicted boundary is not limited by and may extend past the FEA mesh boundary to reflect the response of the finite element model over a range of simulated loads.

Figures 5A, 5B:
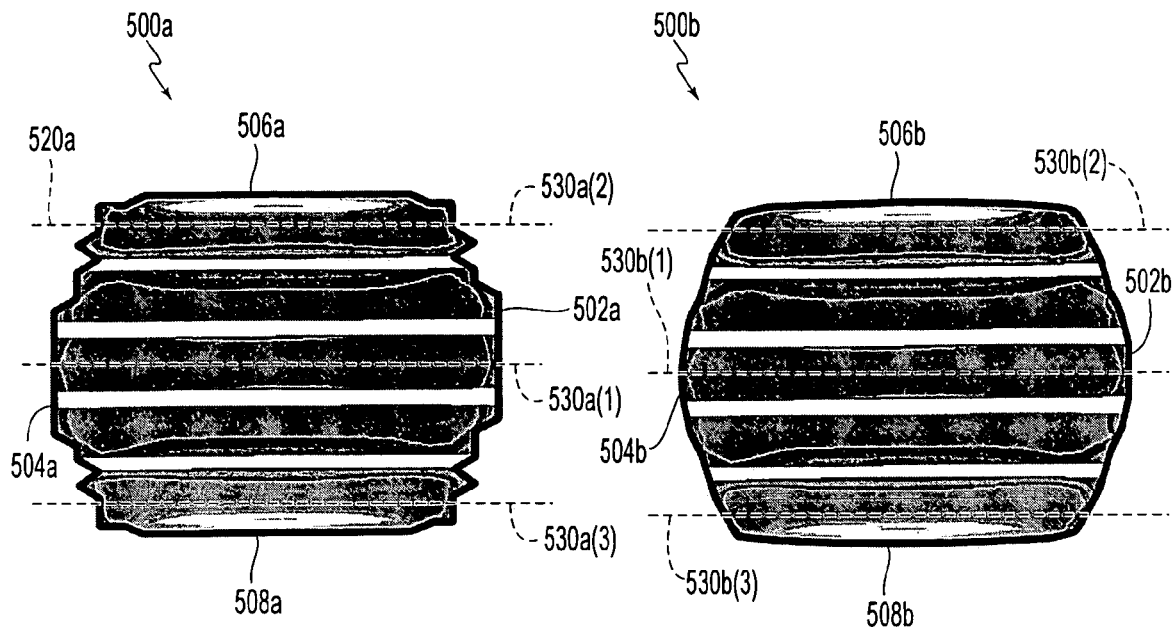
FIG. 5A is a second representative finite element analysis generated contact region.
FIG. 5B is the representative contact region of FIG. 5A in which the contact region boundary has been predicted in accordance with an exemplary embodiment of the present invention.
Figures 6A, 6B:
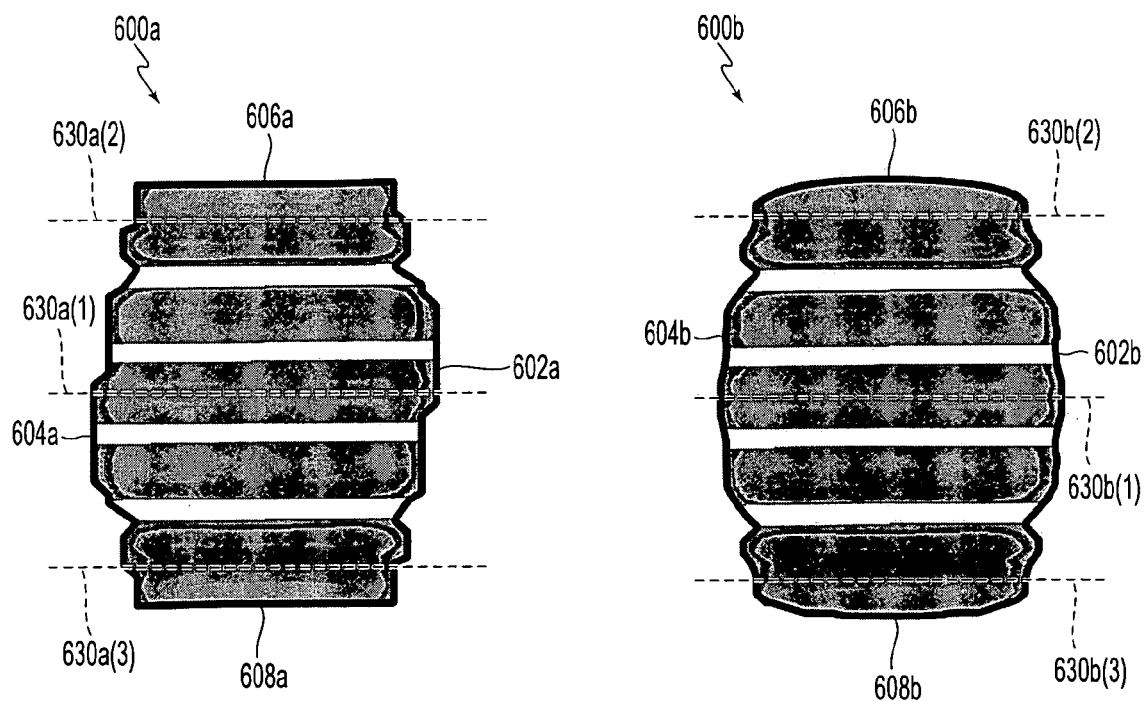
FIG. 6A is a third representative finite element analysis generated contact region.
FIG. 6B is the representative contact region of FIG. 6A in which the contact region boundary has been predicted in accordance with an exemplary embodiment of the present invention.

FIGS. 5A/5B and FIGS. 6A/6B present comparison views, similar to the comparison views presented in FIGS. 4A/4B, of two different automobile tire FEA contact regions. The figure naming and numbering conventions used in FIGS. 4A and 4B have been continued with respect to FIGS. 5A/5B and FIGS. 6A/6B to identify like figure views and like figure features. Visual comparison of the respective FEA based boundaries in FIG. 5a and FIG. 6a with the load-averaged based predicted boundaries in FIG. 5B and FIG. 6B, clearly demonstrate the effect of using load-average based predicted boundaries.

Comparison of the load-average based predicted boundaries with the results of physical experiments has demonstrated that load-average based predicted boundaries more closely reflect contact region boundaries observed in the physical world. A conventional technique used to characterized the effects of load upon an automobile tire is the ratio of the length of the tire centerline (shown at 530a(1), 530b(1), 630a(1) and 630b(1) in FIGS. 5A-6B, respectively) with the length of a left tire shoulder line (shown at 530a(2), 530b(2), 630a(2) and 630b(2) in FIGS. 5A-6B, respectively) and/or a right tire shoulder line (shown at 530a(3), 530b(3), 630a(3) and 630b(3) in FIGS. 5A-6B, respectively).

A reliable tire design is typically expected to demonstrate a gentle positively sloped, linear response in its centerline-to-shoulder ratio in response to linearly increased loading conditions over a load range compatible with the intended operational use of the tire. Contact region boundaries produced using convention FEA based techniques have typically not supported analysis of tire load responses based upon centerline-to-shoulder ratio analysis. Due to the discrete nature of boundaries generated by conventional FEA analysis, centerline-to-shoulder ratio information is typically obscured. Fortunately, contact region boundaries based upon load-averaged data more accurately represent the curvature of the left and right tire shoulder relative to the tire centerline. As a result, centerline-to-shoulder ratios based upon contact region boundaries upon load-averaged data more accurately reflect the expected nature of centerline-to-shoulder ratios observed in physical experiments.

Figure 7:
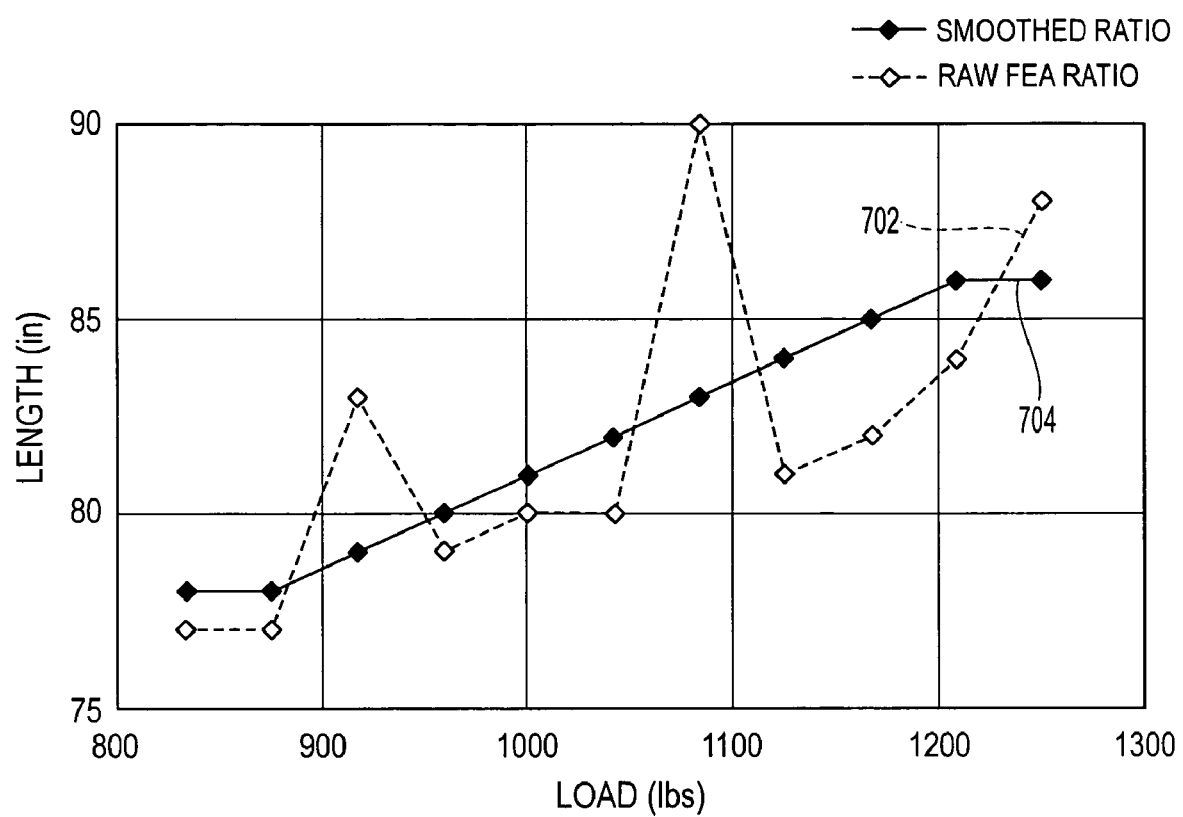
FIG. 7 charts representative contact region shoulder-to-centerline length ratio information for a range of simulated loads.

FIG. 7 presents a plot of centerline-to-shoulder ratios calculated for FEA generated contact region boundaries (plot 702) and contact region boundaries (plot 704) based upon load-averaged data. The plots represent centerline-to-shoulder ratios based upon contact region boundaries generated using the two different approaches, but based upon the same finite element analysis model using the same FEA mesh resolution. As seen in FIG. 7, at 702, the discrete nature of the FEA generated contact region boundaries results in a centerline-to-shoulder ratio plot that significantly deviates from expected results. Fortunately, the contact region boundaries (plot 704) based upon load-averaged data provide a centerline-to-shoulder ratio response to loading that is consistent with centerline-to-shoulder ratio responses observed in physical experiments.

A mesh may be specified in any manner that conveys the distance between the points of intersection in the mesh. By way of a first example, an FEA mesh to be applied to a planar finite element model may be specified in terms of a horizontal and vertical separation between the respective point of intersection. By way of a second example, in an FEA system configured to support finite element analysis of the outer surface, or tread, of an automobile tire, an FEA mesh may be defined by specifying a mesh vertical parameter in terms of rotational degrees (e.g. 0° to 180°) and a mesh width parameter in terms of a linear distance (e.g., 1 mm to 20 mm). For example, in such a system a relatively fine mesh may be defined as having a 1 degree vertical spacing and a 1 mm horizontal spacing between FEA mesh points. A relatively coarse mesh may be defined as having a 2 degree vertical spacing and a 9 mm horizontal spacing between FEA mesh points. Although the resolution of the mesh used for an FEA analysis is typically user configurable. Finer resolutions may produce a more detailed andlor accurate FEA analysis, however, the need for such resolution must typically be balanced at least by limitations with respect to the availability of processing resources, completion schedules, as described above.

For example, with respect to tire tread analysis, a default FEA mesh resolution with a vertical separation of 1-3 degrees and a horizontal separation between 1 mm to 9 mm may be used. One exemplary configuration may use a vertical separation of 2-3 degrees and a horizontal separation of 7 mm. Another exemplary configuration may use a vertical separation of 1 degree and a horizontal separation of 5 mm.

The load averaging based approach of the present invention for determining contact region boundaries yields quantitative metrics which are consistent across tire loads. The approach allows reduced mesh resolution without decreasing the ability of the model to predict footprint length, width, shoulder length, ratio and shape. The approach allows the finite element model to predict contact region lengths and widths which do not fall at node locations. The method has a negligible effect on footprint pressure distribution and pressure balance. Further, validation test results indicate that runtimes can be reduced from an average processing time of 6-16 hrs to an average processing time 1-2 hrs without loss of accuracy. For example, using the approach described here a user may specify a finite element analysis mesh with a resolution that is as much as twenty times a desired resolution in the contact region.

It will be appreciated that the exemplary embodiments described above and illustrated in the drawings represent are only a few of the many ways of implementing and applying finite element analysis with contact region boundary prediction. The present invention is not limited to the specific applications disclosed herein, but may be applied to any field that uses finite element analysis to predict contact region boundaries.

The contact region boundary prediction process can be implemented in any number of modules and is not limited to the software module architecture described above. Each module can be implemented in any number of ways and are not limited in implementation to execute process flows precisely as described above. The contact region boundary prediction processes described above and illustrated in the flow charts and diagrams may be modified in any manner that accomplishes the functions described herein.

It is to be understood that various functions of the contact region boundary prediction method and apparatus may be distributed in any manner among any quantity (e.g., one or more) of hardware and/or software modules or units, computer or processing systems or circuitry.

Contact region boundary prediction module(s) may be integrated within a stand-alone system or may execute separately and be coupled to any number of devices, workstation computers, server computers or data storage devices via any communications medium (e.g., network, modem, direct connection, etc.). The contact region boundary prediction process can be implemented by any quantity of devices and/or any quantity of personal or other type of devices computer or processing system (e.g., IBM-compatible, Apple, Macintosh, laptop, palm pilot, microprocessor, etc.). The computer system may include any commercially available operating system (e.g., Windows, OS/2, Unix, Linux, DOS, etc.), any commercially available and/or custom software (e.g., communications software, load-averaged smoothing process software, etc.) and any types of input devices (e.g., keyboard, mouse, microphone, I/O port, etc.).

It is to be understood that the software of the contact region boundary prediction process may be implemented in any desired computer language, and could be developed by one of ordinary skill in the computer and/or programming arts based on the functional description contained herein and the flow charts illustrated in the drawings. For example, in one exemplary embodiment the contact region boundary prediction process can be written using the C+ programming language, however, the present invention is not limited to being implemented in any specific programming language. The various modules and data sets may be stored in any quantity or types of file, data or database structures. Moreover, the contact region boundary prediction software may be distributed via any suitable medium (e.g., stored on devices such as CD-ROM and diskette, downloaded from the Internet or other network (e.g., via packets and/or carrier signals), downloaded from a bulletin board (e.g., via carrier signals), or other conventional distribution mechanisms).

The format and structure of internal structures used to hold intermediate information in support of the contact region boundary prediction process can include any and all structures and fields and are not limited to files, arrays, matrices, status and control booleans/variables.

The contact region boundary prediction software may be installed and executed on a computer system in any conventional or other manner (e.g., an install program, copying files, entering an execute command, etc.). The functions associated with a system that uses contact region boundary prediction (e.g., generating FEA results for a range of loads, calculating a boundary for each load, processing boundaries from multiple loads to fit equations to boundary length and width values locations, generating a predicted boundary based upon load-averaged data and merging a specified result case with an appropriate boundary, etc.) may be performed on any quantity of computers or other processing systems. Further, the specific functions may be assigned to one or more of the computer systems in any desired fashion.

The contact region boundary prediction process may accommodate any quantity and any type of data set files and/or databases or other structures containing stored data sets, measured data sets and/or residual data sets in any desired format (e.g., ASCII, plain text, any word processor or other application format, etc.).

Contact region boundary prediction output can be presented to the user in any manner using numeric and/or visual presentation formats. Contact region boundary prediction output can be presented as input to a numerical analysis tool in either numeric or visual form and can be processed by the numerical analysis tool in any manner and/or using any number of threshold values and/or rule sets. For example, a technician can visually interpret contact region boundary prediction results via direct inspection of the contact region boundary prediction numeric output, inspection of an generated FEA image that has been smoothed using the contact region boundary prediction process, or inspection of output from a numerical analyzer that has further numerically processed the contact region boundary prediction output.

Information and/or images based upon a generated contact region predicted boundary may be displayed or otherwise presented for inspection by a user independently of an FEA contact region. Alternatively, an FEA contact region may be scaled for display within the predicted boundary. For example, an FEA contact region may be vertically scaled along each FEA mesh vertical line to the length associated with the predicted boundary at that mesh vertical line and the FEA contact region may be horizontally scaled along each FEA mesh horizontal line to the width associated with the predicted boundary at that mesh horizontal line.

Further, any references herein of software performing various functions generally refer to computer systems or processors performing those functions under software control. The computer system may alternatively be implemented by hardware or other processing circuitry. The various functions of the contact region boundary prediction process may be distributed in any manner among any quantity (e.g., one or more) of hardware and/or software modules or units, computer or processing systems or circuitry, where the computer or processing systems may be disposed locally or remotely of each other and communicate via any suitable communications medium (e.g., LAN, WAN, Intranet, Internet, hardwire, modem connection, wireless, etc.). The software and/or processes described above and illustrated in the flow charts and diagrams may be modified in any manner that accomplishes the functions described herein.

From the foregoing description it will be appreciated that the present invention includes a novel finite element analysis contact region boundary prediction system and method that is capable of accurately predicting finite element analysis contact region boundaries based upon an assessment of finite element analysis boundary results generated for multiple simulated loads within a range of operational load conditions.

Having described exemplary embodiment of a contact region boundary prediction system, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in their ordinary and accustomed manner only, unless expressly defined differently herein, and not for purposes of limitation.

What is claimed is:

1. A method for smoothing a perimeter boundary of a finite element analysis generated contact region between a tire and a road surface, comprising:
   (a) generating a plurality of contact regions, each contact region generated for the tire against the road surface by performing a finite element analysis for each of a plurality of given load condition values;
   (b) generating a contact region boundary data for each of the plurality of contact regions by determining at least a length of the contact region and a width of the contact region;
   (c) generating a plurality of load-averaged curve equations based upon the contact region boundary data; and
   (d) generating a predicted boundary for a given contact region based on the plurality of load-averaged curve equations;
   (e) displaying the given contact region within the predicted boundary,
   wherein each contact region between the tire and the road surface is an area of contact between the tire and the road surface, and
   wherein the contact region boundary data defines an outer perimeter of the respective contact region.

2. The method of claim 1, further comprising:
   (f) scaling the displayed given contact region within the predicted boundary.

3. The method of claim 1, wherein the contact region is generated by selecting a finite element model.

4. The method of claim 3, wherein the finite element model includes a model of a tread of an automobile tire.

5. The method of claim 2, wherein the finite element analysis includes use of a finite element analysis mesh with a resolution that is not more than twenty times a desired resolution in the contact region.

6. The method of claim 5, wherein the plurality of load condition values are incrementally spaced across a range of load condition values.

7. An apparatus for smoothing a perimeter boundary of a finite element analysis generated contact region between a tire and a road surface, comprising:
   an analysis module that generates a plurality of contact regions, each contact region generated for the tire against the road surface by performing a finite element analysis for each of a plurality of given load condition values;
   a boundary module that generates a contact region boundary data for each of the plurality of contact regions by determining at least a length of the contact region and a width of the contact region;
   a curve-fitting module that generates a plurality of load-averaged curve equations based upon the contact region boundary data;
   a merge module that generates a predicted boundary for a given contact region based on the plurality of load-averaged curve equations;
   a display device; and
   an input/output module that interfaces with the display device to display the given contact region within the predicted boundary,
   wherein each contact region between the tire and the road surface is an area of contact between the tire and the road surface, and
   wherein the contact region boundary data defines an outer perimeter of the respective contact region.

8. The apparatus of claim 7, wherein the merge module further comprises:
   a scaling module that scales the displayed given contact region within the predicted boundary.

9. A program product apparatus having a computer readable storage medium with computer program logic recorded thereon that is executed by a computer to smooth a perimeter boundary of a finite element analysis generated contact region between a tire and a road surface, comprising:
   an analysis module that generates a plurality of contact regions, each contact region generated for the tire against the road surface by performing a finite element analysis for each of a plurality of given load condition values;
   a boundary module that generates a contact region boundary data for each of the plurality contact regions by determining at least a length of the contact region and a width of the contact region;
   a curve-fitting module that generates a plurality of load-averaged curve equations based upon the contact region boundary data;
   a merge module that generates a predicted boundary for a given contact region based on the plurality of load-averaged curve equations; and
   an input/output module that displays the given contact region within the predicted boundary,
   wherein each contact region between the tire and the road surface is an area of contact between the tire and the road surface, and
   wherein the contact region boundary data defines an outer perimeter of the respective contact region.

10. The program product of claim 9, wherein the merge module further comprises:
    a scaling module that scales the displayed given contact region within the predicted boundary.

11. The method of claim 2, wherein the given contact region is vertically scaled along a finite element model mesh vertical line to a length associated with the predicted boundary at that mesh vertical line and the given contact region is horizontally scaled along each finite element model mesh to a width associated with the predicted boundary at that mesh horizontal line.

12. The apparatus of claim 8, wherein the scaling module vertically scales the given contact region along a finite element model mesh vertical line to a length associated with the predicted boundary at that mesh vertical line and the scaling module horizontally scales the given contact region along each finite element model mesh to a width associated with the predicted boundary at that mesh horizontal line.

13. The apparatus of claim 10, wherein the scaling module vertically scales the given contact region along a finite element model mesh vertical line to a length associated with the predicted boundary at that mesh vertical line and the scaling module horizontally scales the given contact region along each finite element model mesh to a width associated with the predicted boundary at that mesh horizontal line.

* * * * *